United States Patent
Edlinger et al.

(10) Patent No.: US 10,638,637 B2
(45) Date of Patent: Apr. 28, 2020

(54) COMPONENT COOLING DEVICE

(71) Applicant: ZKW GROUP GMBH, Wieselburg (AT)

(72) Inventors: Erik Edlinger, Vienna (AT); Dietmar Kieslinger, Theresienfeld (AT); Emanuel Weber, Baden (AT)

(73) Assignee: ZKW GROUP GMBH, Wieselburg (AT)

( * ) Notice: Subject to any disclaimer, the term of this patent is extended or adjusted under 35 U.S.C. 154(b) by 0 days.

(21) Appl. No.: 16/092,804

(22) PCT Filed: Apr. 5, 2017

(86) PCT No.: PCT/AT2017/060085
§ 371 (c)(1),
(2) Date: Oct. 11, 2018

(87) PCT Pub. No.: WO2017/177249
PCT Pub. Date: Oct. 19, 2017

(65) Prior Publication Data
US 2019/0132988 A1  May 2, 2019

(30) Foreign Application Priority Data
Apr. 13, 2016 (AT) .............................. A 50317/2016

(51) Int. Cl.
*H05K 7/20* (2006.01)
*H01L 23/467* (2006.01)
(Continued)

(52) U.S. Cl.
CPC .......... *H05K 7/20127* (2013.01); *F21S 45/47* (2018.01); *F21S 45/49* (2018.01);
(Continued)

(58) Field of Classification Search
CPC .. H05K 7/20127; H05K 1/181; H05K 1/0206; H05K 2201/10257;
(Continued)

(56) References Cited

U.S. PATENT DOCUMENTS

| | | | |
|---|---|---|---|
| 7,192,559 B2 * | 3/2007 | Chow | B01D 61/18 137/87.01 |
| 2009/0098540 A1 * | 4/2009 | Baeumner | G01N 27/3277 435/6.12 |

(Continued)

FOREIGN PATENT DOCUMENTS

| | | |
|---|---|---|
| CN | 103153033 A | 6/2013 |
| DE | 202014101348 | 5/2014 |

(Continued)

OTHER PUBLICATIONS

First Office Action for Austrian Application No. A 50317/2016, dated Feb. 21, 2017.
International Search Report for PCT/AT2017/060085, dated Jun. 20, 2017.

* cited by examiner

*Primary Examiner* — Kevin Quarterman
(74) *Attorney, Agent, or Firm* — Eversheds Sutherland (US) LLP

(57) ABSTRACT

A component cooling device (101) comprising: a circuit board (102), the circuit board (102) having an upper side (103) and a lower side (104) facing away from the upper side (103); and at least one electronic component (106) and at least one hollow circuit board opening (107) for a gaseous cooling medium for cooling the component, wherein on the lower side (104) of the circuit board (102) is provided a guide (110) which forms a flow channel (109) that has at least one inlet (113) and at least one outlet, which is formed by the at least one circuit board opening (107), for at least one convection flow (108) of the cooling medium.

22 Claims, 9 Drawing Sheets

(51) Int. Cl.
*F21S 45/49* (2018.01)
*F21S 45/47* (2018.01)
*H05K 1/02* (2006.01)
*H05K 1/18* (2006.01)

(52) U.S. Cl.
CPC ......... *H01L 23/467* (2013.01); *H05K 1/0206* (2013.01); *H05K 1/181* (2013.01); *H05K 7/20145* (2013.01); *H05K 2201/09609* (2013.01); *H05K 2201/10022* (2013.01); *H05K 2201/10106* (2013.01); *H05K 2201/10257* (2013.01)

(58) Field of Classification Search
CPC .......... H05K 2201/10106; H05K 2201/10022; H05K 2201/09609; H05K 7/20145; H05K 7/20845; H05K 1/0203; F21S 45/47; F21S 45/49; F21S 45/43; H01L 23/467
See application file for complete search history.

(56) References Cited

U.S. PATENT DOCUMENTS

| | | | |
|---|---|---|---|
| 2009/0207568 A1 | 8/2009 | Haveri | |
| 2011/0228489 A1* | 9/2011 | Emery | H05K 1/0272 361/748 |
| 2011/0308791 A1* | 12/2011 | Overmeyer | E21B 36/001 166/250.01 |
| 2016/0169497 A1* | 6/2016 | Kratochvil | B60Q 1/06 362/547 |

FOREIGN PATENT DOCUMENTS

| | | |
|---|---|---|
| EP | 1777919 A1 | 4/2007 |
| JP | 2005166777 A | 6/2005 |
| JP | 2006100483 A | 4/2006 |
| JP | 2008301592 A | 12/2008 |
| JP | 2009098420 A | 5/2009 |
| JP | 2014235878 A | 12/2014 |
| JP | 2015162395 A | 9/2015 |
| WO | 2009153735 A1 | 12/2009 |

COMPONENT COOLING DEVICE

The invention relates to a component cooling device comprising a circuit board, the circuit board having an upper side and a lower side facing away from the upper side, and at least one electronic component and at least one hollow circuit board opening for a gaseous cooling medium for cooling the electric component. The component cooling device is provided in particular for use in vehicles and vehicle headlamps.

In the field of microelectronics and power electronics, high power losses are often produced by electrical and electronic components, the waste heat of which must be dissipated via a suitable component cooling devices. A heat sink is often arranged directly on a component. Alternatively, a component may be arranged on a circuit board in such a way that the circuit board itself dissipates the heat or transports it to a location at which the heat is then absorbed by a heat sink. To this end, "thermal" plated through-holes are often used, which are usually economically sensible only for multi-layer circuit boards and consequently are costly to produce and therefore are seldom used in economically viable solutions. The cooling methods according to the prior art are generally costly, since the required heat sinks have a correspondingly large design and are usually calculated on the basis of the thermostatic principle. The required overall size not only entails corresponding unit costs, but requires a suitable, usually complex and costly assembly, and the resultant overall mass of a circuit cooled in this way may be disadvantageous for specific applications, in particular in the case of mobile applications, such as those in a motor vehicle. Vibrations, available installation space, and dissipation of heat from closed modules, such as a vehicle headlamp, constitute further limiting aspects in respect of the dimensioning of a component cooling device, in particular for components of circuits for motor vehicles, particularly for vehicle headlamps.

A circuit assembly on a circuit board for a use according to the invention comprises at least one electrical or electronic component. However, a plurality of components of this kind can also be arranged on a circuit board, however usually only some of the used components are power components which generate a high electrical power loss during operation and need to be cooled. Cooling concepts suitable for this purpose relate either to individual components or also to a plurality of components jointly.

The object of the present invention is to provide a component cooling device which overcomes the above-mentioned disadvantages.

The object is achieved by a component cooling device of the kind described in the introduction, in which on the lower side of the circuit board is arranged a guide which forms a flow channel that has at least one inlet and at least one outlet which is formed by the at least one circuit board opening, for at least one convection flow of the cooling medium, generally the ambient air. The at least one convection flow can flow here through the flow channel and the at least one circuit board opening from the lower side to the upper side.

It is particularly advantageous if the flow channel is delimited by the guide and a region of the lower side of the circuit board. As a result of this arrangement, a flow channel can be formed with extremely little effort, since the circuit board itself also delimits the flow channel and the guide therefore can be formed particularly easily.

It is additionally favourable if the at least one circuit board opening is likewise arranged in this region, which can be implemented particularly easily.

It is additionally favourable if the region of the flow channel on the lower side of the circuit board comprises at least one cooling area, wherein the at least one cooling area is delimited substantially by a contour or planar extent of the at least one component on the circuit board and is arranged on the lower side of the circuit board. In other words, the cooling area is largely coincident with the area that is covered on the circuit board by the component mounted on the upper side, but is arranged on the lower side of the circuit board. The at least one cooling area can be heated significantly by the component, and therefore a particularly good cooling effect for the at least one component can be achieved by a convection flow over the cooling area. However, the cooling area may of course also be larger, in particular if heat-spreading areas or heat radiation areas are arranged on a circuit board.

It may likewise be advantageous if the at least one inlet of the flow channel preferably has a rectangular shape and the cross-section of the at least one inlet is larger than the cross-section of the at least one outlet; it may also be advantageous if the flow channel has a height transverse to the circuit board that decreases from the at least one inlet to the at least one outlet.

In a further aspect of the invention, by means of the arrangement of a nozzle-like structure, which utilises the Venturi effect, at least one convection flow with rising air can flow from the lower side to the upper side of a circuit board through a circuit board opening and in so doing can entrain waste heat. The nozzle-like structure is formed by the flow channel and the at least one circuit board opening, wherein the cross-section of the flow channel decreases starting from the at least one inlet to the at least one outlet.

The at least one circuit board opening is preferably also arranged in the region of the flow channel on the lower side of the circuit board, which further promotes the cooling effect of the assembly.

A flow channel of this kind can be produced particularly easily and economically for example by being stamped from a sheet metal, folded and connected to the circuit board, preferably soldered. Here, the flow channel preferably has a rectangular cross-section transversely to the at least one convection flow. A corresponding shape of the flow channel can assist economical production, for example a rectangular cross-section of the flow channel, wherein it is not crucial for the corners, edges and side walls of the flow channel to correspond precisely to a rectangle.

The cost advantages of the invention are particularly great if the guide is formed from three side walls adjoining one another and one adjoining end face, and the guide, jointly with the region of the lower side of the circuit board and the circuit board opening, forms the flow channel.

It is advantageous if the flow channel is designed in such a way that three side walls and one end face are formed for example by a stamped and folded sheet metal and a fourth side wall of the flow channel is formed by the circuit board. This results in cost advantages in respect of material and assembly.

Circuit boards both for SMT (surface mount technology) assembly and for THT (through hole technology) assembly can be used for the invention.

It is favourable in particular for a circuit board for SMT assembly if at least one contact connection area on the upper side is connected to at least one heat radiation area on the lower side by at least one hollow, electrically conductive circuit board opening.

For a circuit board for THT assembly, it is favourable if at least one contact of at least one component is plugged through the circuit board and in this way a contact connection area is connected to a heat radiation area on the lower side.

For improved heat dissipation by means of the at least one convection flow, it is advantageous if at least one heat-spreading area or at least one heat radiation area increases the surface suitable for heat dissipation. The at least one heat-spreading area or heat radiation area is preferably made from an electrically and thermally conductive material, in particular from a copper layer, which is applied to at least one side of the circuit board and is preferably structured.

The cost advantages of the invention are particularly great if the circuit board is formed in one layer and has metal layers (preferably structured) on both sides.

It is particularly advantageous, if more than one heat-spreading area or more than one heat radiation area are provided, for said heat-spreading areas or heat radiation areas, which are arranged on the upper side or lower side of the circuit board, to be connected to one another. This connection preferably may be achieved by at least one electrically conductive circuit board opening, which particularly preferably at the same time forms the at least one passage for the at least one convection flow.

The at least one convection flow can be intensified particularly easily by connecting the at least one circuit board opening to at least one chimney structure. It is advantageous if the connection between the at least one chimney structure and the at least one circuit board opening is airtight, in particular by way of soldering or adhesive bonding.

It is therefore particularly favourable if at least one chimney structure for intensifying the at least one convection flow is arranged on the upper side and the at least one hollow circuit board opening leads out into the at least one thermal chimney structure.

A particularly advantageous embodiment is provided if the at least one chimney structure has a chimney height greater than the diameter of the at least one circuit board opening, preferably at least five times greater, particularly preferably at least ten times greater, and the chimney diameter corresponds substantially to the diameter of the at least one circuit board opening.

The at least one chimney structure may preferably be made of an electrically conductive material, so as to be used at the same time as a cooling material. The at least one chimney structure may, for example, be a pipe or a differently shaped hollow line. A mechanically stable material is favourable in order to obtain a fixed connection to the circuit board.

It is advantageous if the chimney diameter at least in part extends in a non-constant manner along the chimney height or, at one end of the chimney structure at which a soldered connection for fastening the chimney structure is provided, extends in a widening manner. This embodiment may be applied advantageously to the extent that an increased cross-section in the fastening region of the chimney structure leads to an increased circumferential length, which corresponds to the length for example of a soldered connection for fastening the chimney structure on a circuit board and consequently leads to a connection capable of bearing a mechanical load. In particular with use of cooling devices of this kind in a vehicle headlamp, mechanical parameters of this kind are decisive for example for fastening and ageing. For example, wire ferrules, which are made of metal and additionally often have a widening at one end, are particularly suitable as chimney structures.

The effective chimney height may, in a development of the invention, be increased by a connection of the at least one chimney structure to at least one second chimney structure, which can be arranged upstream and downstream of the flow channel. In other words, various chimney structures which are made of different materials, which may, for example, be designed to be mechanically rigid or elastically malleable, preferably a tube, in particular a rubber or plastics tube, and which jointly form a chimney structure may be arranged in a row. The joint chimney structure is preferably connected to at least one further component of a vehicle headlamp and can lead to a further intensification of the at least one convection flow.

In particular with use of a chimney structure, it is particularly advantageous if a circuit board in the installed position is oriented substantially horizontally, since a vertically oriented chimney structure acts particularly effectively as a result and the component cooling device therefore can be cooled particularly effectively. Consequently, a preferred installed position of the circuit board has an angle to the horizontal in the range of −45° to +45°, particularly preferably in the range of −10° to +10°, most preferably in the range of −5° to +5°. Special arrangements of the flow channel of the chimney structure, however, can also provide a vertical orientation of the circuit board.

The component cooling device is advantageous in particular if it is arranged within a vehicle headlamp and is preferably designed to cool a light source for example for a main beam light source or dipped beam light source. The costs and the weight for a vehicle headlight can thus be kept particularly low, this being made possible for the first time by the cooling concept according to the invention. Main beam light sources or dipped beam light sources in principle have higher light outputs, for example as compared to light sources for indicators. Light sources with a higher light output, during operation, also produce a higher power loss in the form of heat, which can be cooled in a particularly robust, simple and economical manner by means of the component cooling device according to the invention.

For a vehicle headlamp having one or more light sources which can radiate light in order to produce a light distribution, in particular a main beam or dipped beam light distribution, the component cooling device according to the invention can be used in a particularly advantageous manner for cooling the one or more light sources, since the component cooling device can be used particularly robustly, easily and cost-efficiently in motor vehicles.

The invention and advantages thereof will be described in greater detail hereinafter with reference to non-limiting exemplary embodiments which are illustrated in the accompanying drawings, in which.

The terms "upper side" and "lower side" of a circuit board as used hereinafter relate to the two sides of the circuit board, but do not characterise an installed position of the circuit board and are used merely to provide a better understanding of the description.

Of course, it is dependent on the particular situation of installation as to whether the upper side or lower side is actually arranged at the top or bottom. The terms "upper side" and lower side" of a circuit board therefore are not to be understood to be limiting and do not characterise the invention in respect of their literal meaning. In other words, a circuit board of a component cooling device according to the invention can also be assembled in a slanting manner or vertically, and the "upper side" in the installed state, for example in a vehicle headlamp, does not have to be oriented upwardly.

In the following exemplary embodiments, a component 6, 106, 206, 306, 406, 506 is shown, wherein more than one component generally can also be arranged on a circuit board. For better understanding, just one individual component will be used hereinafter, however it is clear that a plurality of components can also be intended in accordance with the wording in the general description and the claims. The same is true for "a" convection flow, "an" inlet, "an" outlet, and "a" circuit board opening, which relate respectively to at least one convection flow, at least one inlet, at least one outlet, and at least one circuit board opening.

Furthermore, features such as contact connection areas are presented in the following exemplary embodiments, but can vary depending on the design of the used components. In the shown illustrations, SMD (surface mount device) components for SMT (surface mount technology) assembly are visible, wherein other designs requiring different assembly techniques, such as THT (through-hole technology) assembly, can be used similarly, this technique enjoying widespread application in particular in the field of power electronics.

All of the following exemplary embodiments show variants of the invention and, in respect of the number, type and arrangement of components, are not limited by the features presented and described in the exemplary embodiments. For improved understanding, a circuit assembly of low complexity on a circuit board has been selected in the exemplary embodiments and is used merely to explain the basic operating principle of the component cooling device. This is in no way to be considered limiting with regard to more complex circuit assemblies. Furthermore, the invention can be combined with conventional component cooling devices, in particular on a common used circuit board.

Figure 3:
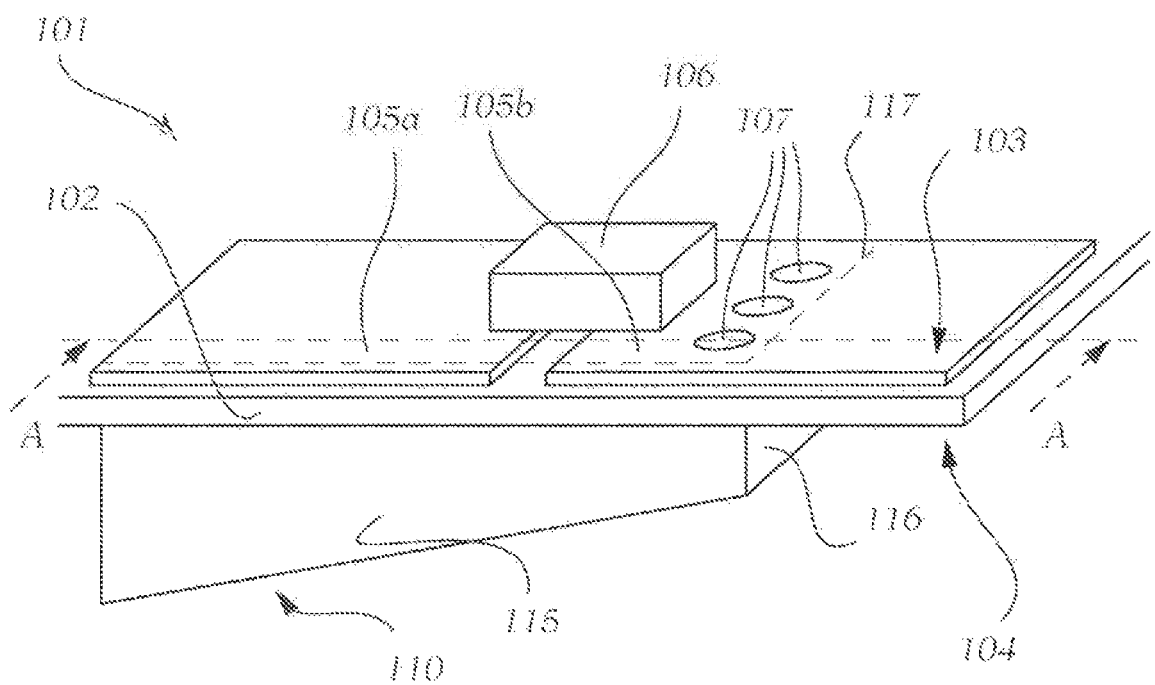
FIG. 3 shows a perspective view of a first embodiment of a component cooling device according to the invention.

FIG. 3 shows a first exemplary embodiment of a component cooling device 101 with a circuit board 102. The circuit board 102 has an upper side 103 and a lower side 104, facing away from the upper side, and comprises at least one electronic component 106, which is arranged preferably on the upper side 103. Metal layers are applied to the upper side 103 and lower side 104 and are structured in such a way that they for example comprise conductor tracks or contact connection areas 105a, 105b and heat radiation areas 105c. The circuit board 102 for example also comprises three preferably hollow-cylindrical circuit board openings 107, which are preferably electrically conductive, so as to effectively electrically and consequently also thermally connect the metal layer on the upper side 103 to the metal layer on the lower side 104.

In principle, however, it is not necessary to incorporate the layer of the lower side 104 into the component cooling device. It is therefore not always necessary to design the circuit board openings 107 to be electrically conductive. However, a particularly good cooling efficiency can be attained by incorporation of the layer on the lower side 104.

Figure 1:
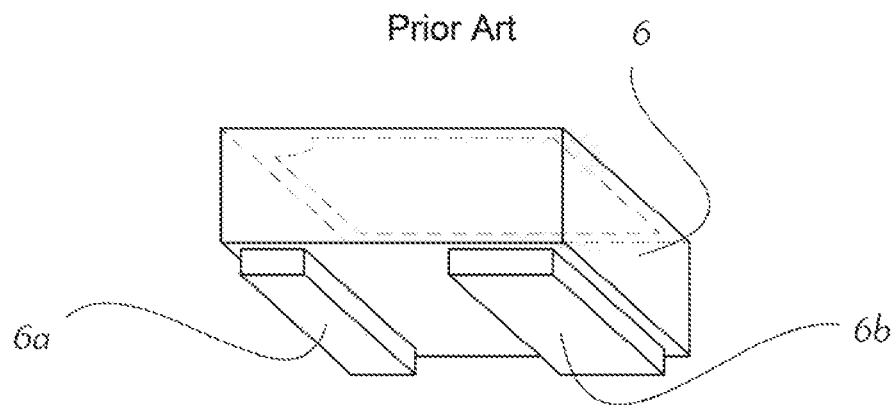
FIG. 1 shows a perspective view of an electronic component from the field of SMD technology.

FIG. 1 shows an example of an electronic component 6, which is also suitable for component 106 according to FIG. 3, in a perspective view. The electronic component 6 in various exemplary embodiments of the component cooling device is a light-emitting diode in SMD technology and comprises a housing having two contact connections 6a, 6b, which are connected to an anode and a cathode of the light-emitting diode. A light-emitting diode, as is known, consists of a semiconductor crystal and, during operation, besides the radiated light, generates a power loss which is released in the form of heat, the dissipation of which can be facilitated by means of the component cooling device according to the invention. Alternatively, the electronic component 6 can be an ohmic resistor.

The first contact connection 6a of the component 6 for the anode is usually smaller than the second contact connection 6b of the cathode, since internally of the component the cathode can be arranged on the base area of the semiconductor crystal forming the light-emitting diode and can be connected in a planar manner to the second contact connection 6b of the component 6. The anode is arranged for example on an upper side of the semiconductor crystal and is connected via a bonding wire to the second contact connection 6a of the components 6. The inner structure of the component is not shown in the drawings.

Referring again to FIG. 3, it can be seen that the two contact connections 106a, 106b of the component 106, which corresponds to the example of the component 6 from FIG. 1, face towards the circuit board 102.

The electronic component 106 is connected, preferably soldered, e.g. during SMD assembly, via the contact connections 106a, 106b to conductor tracks or contact connection areas 105a, 105b, which are disposed on the upper side 103 of the circuit board 102.

To improve the heat dissipation (i.e. to attain a lower thermal resistance), the contact connection areas 105a, 105b are preferably formed over a large area on the circuit board 102 within the aforesaid layers. The contact connection areas 105a, 105b are good electrical and also thermal conductors. Extended contact connection areas 105a, 105b of this kind are also referred to as "heat-spreading areas".

In the present example, within the component 106 the second contact connection 106b is particularly suitable for heat dissipation on account of the planar connection to the cathode. By comparison, the first contact connection is less suitable for heat dissipation, since the connection to the anode is provided by a bonding wire, and the bonding wire has a much smaller cross-section for the heat dissipation than the planar connection of the cathode. It is therefore particularly advantageous if the hollow-cylindrical circuit board openings 107 are arranged at a relatively short distance from the target placement position of the contact connection 106b on the second contact connection area 105b, so as to make the component cooling device 101 according to the invention particularly effective. The connection or those connections of a component that is/are connected within the component to the thermal mass thereof, that is to say the component housing, will thus preferably be selected in order to connect it/them to the heat-spreading area from which an improved discharge of heat through the component cooling device is possible.

The lower side 104 of the circuit board 102 likewise comprises a metal layer, which can be structured and used both for electrical connections and for thermal heat-spreading areas. It is favourable if the heat-spreading areas 105a, 105b of the upper side 103 are connected to the heat radiation area 105c of the lower side 104, which in this exemplary embodiment is achieved by the electrically conductive circuit board openings 107.

Figure 4:
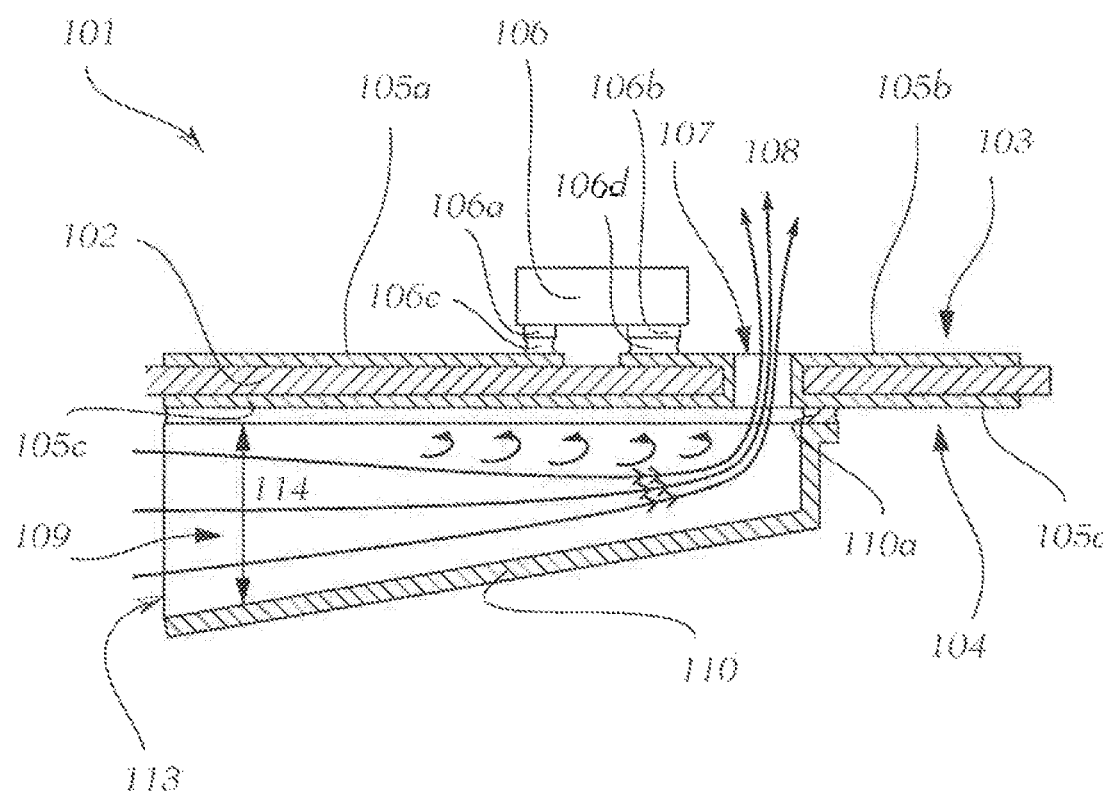
FIG. 4 shows a side view of the component cooling device in the vertical section A-A of FIG. 3.

It can be seen in FIG. 4 that the component 106 can be cooled by a convection flow 108 of a cooling medium, for example ambient air, from the lower side 104 to the upper side 103. The convection flow 108 can flow through a flow channel 109 and through the hollow circuit board openings 107.

The flow channel 109 may be arranged on the lower side 104 at least in a cooling area of the circuit board 102, wherein the cooling area may be delimited in its horizontal extent by the contour of the component 106 and is arranged on the lower side 104 of the circuit board 102. The cooling area may of course also be larger, in particular if heat-spreading areas or heat radiation areas are arranged on the circuit board 102. Generally, an area much larger than just the cooling area is occupied by the flow channel 109. The actual area defined by the flow channel 109 will be referred to hereinafter as the delimitation area. The convection flow 108 can consequently be conducted by means of the flow channel 109 substantially via the delimitation area thereof on the circuit board side, this being understood to mean that the majority of the convection flow can be conducted through the flow channel, however further inlets and outlets can of course also be provided in order to generate a plurality of convection flows, for example in order to attain cooling effects at a plurality of locations on the circuit board 102.

The flow channel 109 comprises an inlet 113, the cross-section of which for example has a rectangular shape, and an outlet, which is formed by the hollow circuit board openings 107. The circuit board openings 107 can consequently be arranged in the region of the flow channel 109. The cross-section of the inlet 113 is preferably larger than the cross-section of the outlet. The flow channel 109 can have a height 114 transversely to the orientation of the circuit board 102 that decreases in a funnel-shaped manner from the inlet 130 to the outlet.

The flow channel 109, by way of the increasingly smaller cross-section of the flow channel 109, forms a nozzle which intensifies a convection flow 108 through the hollow circuit board openings 107. In other words, the flow rate through the flow channel 109 and the circuit board openings 107 is increased, whereby the heat dissipation or the component cooling is improved. The height 114 of the flow channel 109 ensures an increased height difference between the inlet 114 and the outlet (the circuit board opening 107) of the flow channel 109 and promotes the convection of air through the assembly in the vertical direction.

In this example, the flow channel 109 has the shape of a hollow pyramid frustum. Three side walls 115 and one end face 116 are formed by a guide 110. The fourth side wall of the flow channel 109 is formed by a sub-area of the circuit board 102, i.e. the aforesaid delimitation area on the lower side 104 of the circuit board 102. The hollow circuit board openings 107 are arranged within the interior of the flow channel 109, which is indicated by the line 117 in FIG. 3, which shows a contour of the flow channel 109 projected onto the upper side 103.

Figure 2:
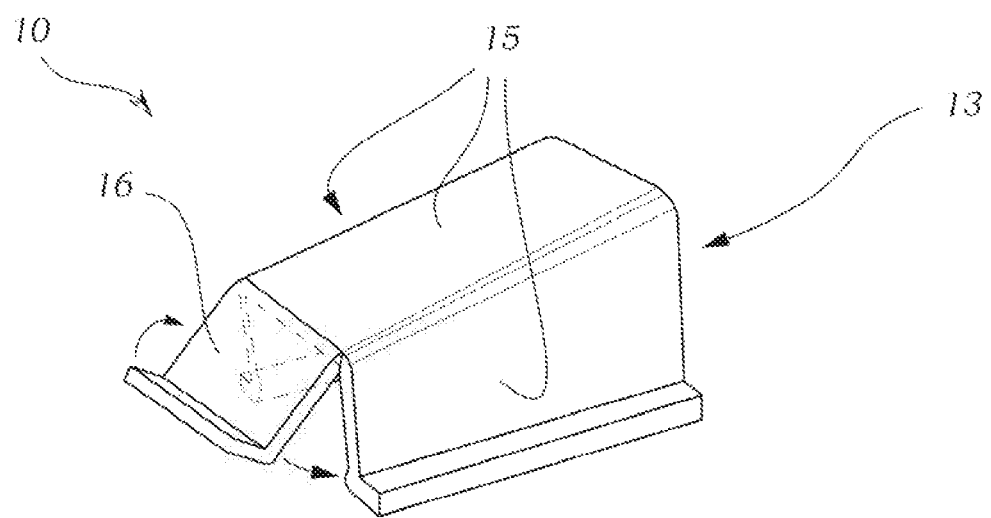
FIG. 2 shows a perspective view of an exemplary embodiment of a guide.

In FIG. 2 an example of a guide 10 which is suitable for various exemplary embodiments according to the invention, in particular for a flow channel 109 according to FIG. 4, is shown and comprises three side walls 15 and one end face 16. The end face 16 faces away from the inlet 13. In this example, the guide 10 can be manufactured from a sheet metal, which is cut to a size suitable for forming a flow channel and in which the side walls 15 can be bent over, this being illustrated by the arrows in FIG. 2. It is favourable if the delimiting edges of the flow channel thus formed are additionally bent over, so as to be able to produce a simple connection, for example by soldering, to a metal layer on a circuit board.

The shown form of the guide 10 offers cost advantages, since the flow channel, considered as a whole, is formed for the first time together with a circuit board, and consequently the material consumption of the guide 10 is reduced by one side wall.

Referring again to FIG. 4, the guide 110 can preferably be secured by means of a solder connection 110a to a circuit board 102. In principle, the guide 110 can be fastened to the circuit board 102 for example also by adhesive bonding, preferably by an adhesive that is a poor electrical conductor or that is not electrically conductive, but is a good thermal conductor, or by means of a plug-in or screw connection.

Referring again to FIG. 4, in order to further increase the heat-spreading area, a metal thermal heat radiation area 105c can be arranged additionally on the lower side 104 of the circuit board 102 and is connected thermally to the contact connection area 105b by means of the circuit board opening 107. As a result of this design, the convection flow 108 flows through the flow channel 109, past the heat radiation area 105c, wherein the cooling effect is improved. In addition, by use of a metal guide 110 together with a thermally conductive connection 110a to the heat radiation area 105c, the cooling effect can be further improved since the guide 110 acts as a heat sink and further reduces the overall thermal resistance.

The circuit board 102 is preferably formed in one layer and has metal layers on both sides, the layers preferably being structured. The circuit board 102 is preferably made of a circuit board material such as FR4. In principle, multi-layer circuit boards may also be used. The cooling device according to the invention, on account of its simple construction, is suitable in particular for economical applications, which usually use one-layer circuit boards.

Figure 5:
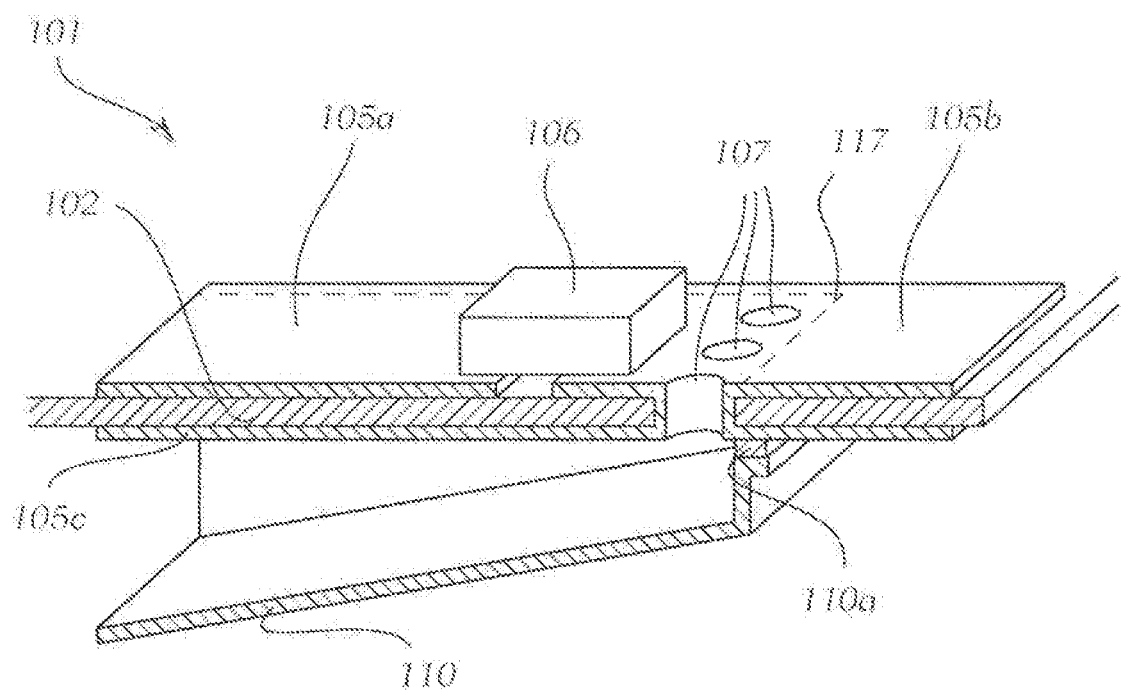
FIG. 5 shows a perspective view in the section A-A of FIG. 3 on an upper side of the first embodiment.
Figure 6:
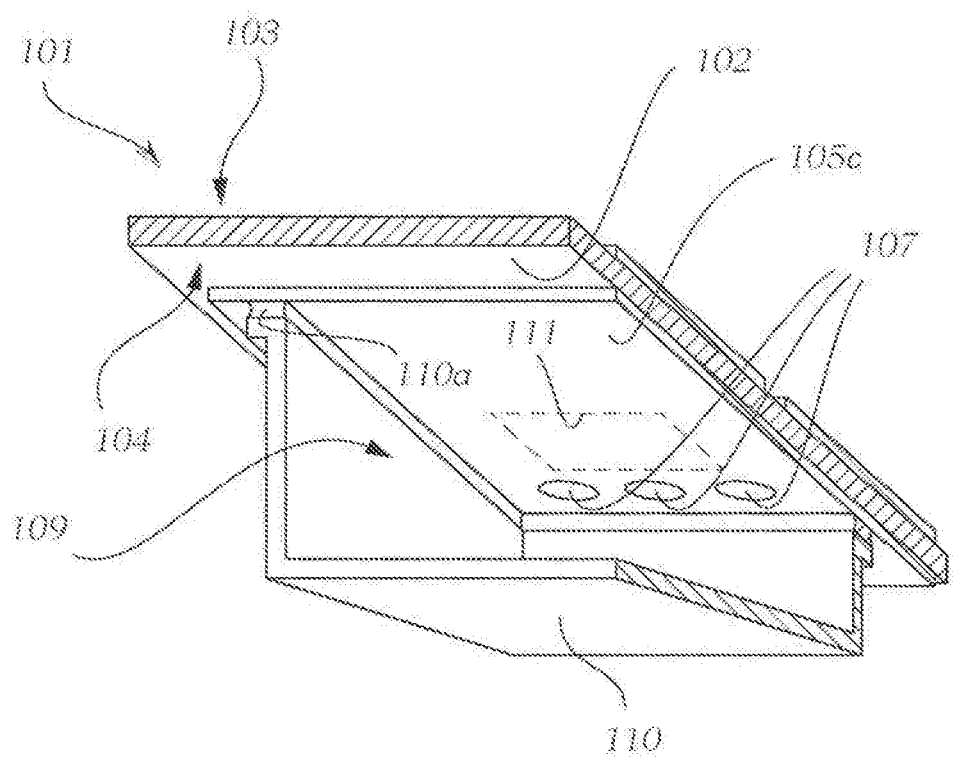
FIG. 6 shows a perspective view in the section A-A of FIG. 3 with a view along the flow channel on a lower side of the first embodiment.

In FIG. 5 and FIG. 6 it can be seen how the guide 110, together with a sub-area of the lower side 104 of the circuit board 102, forms the flow channel 109. The circuit board 102 may comprise a metal-coated lower side 104, which may be connected by means of a solder connection 110a to the guide 110. The hollow circuit board openings 107 may be arranged within the interior of the flow channel 109 in order to form the outlet.

The component 106 can correspond to the example of the component 6 from FIG. 1, and the guide 110 can correspond to the example of the guide 10 from FIG. 2.

Figure 7:
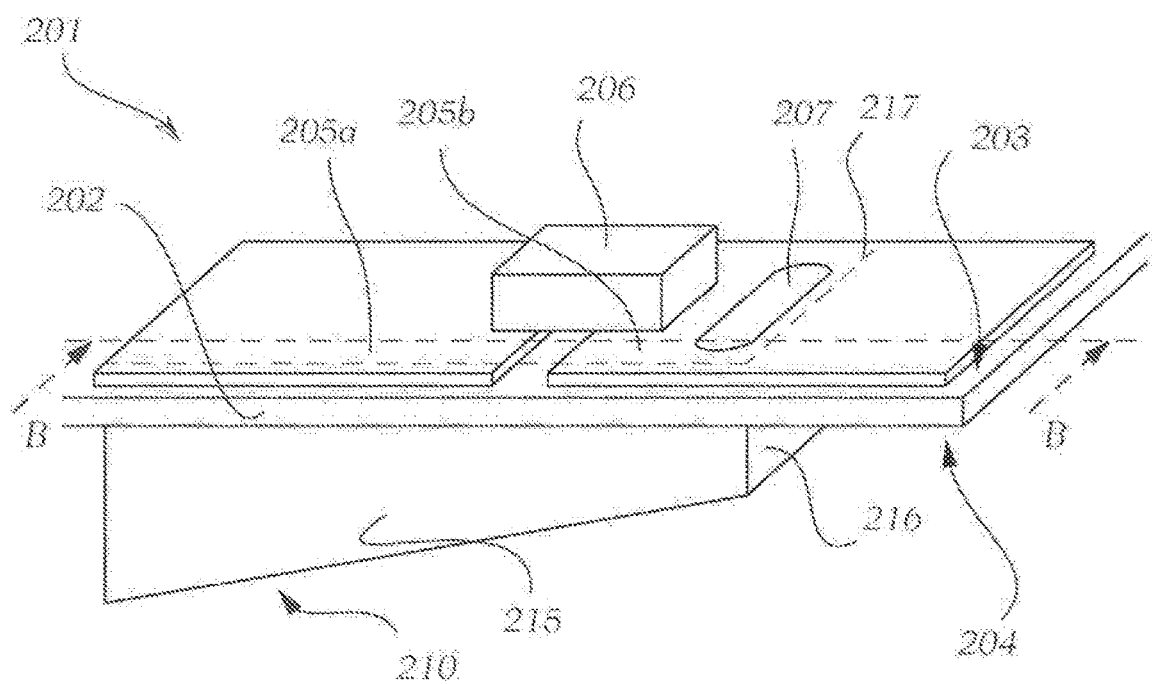
FIG. 7 shows a perspective view of a second embodiment of a component cooling device according to the invention.
Figure 8:
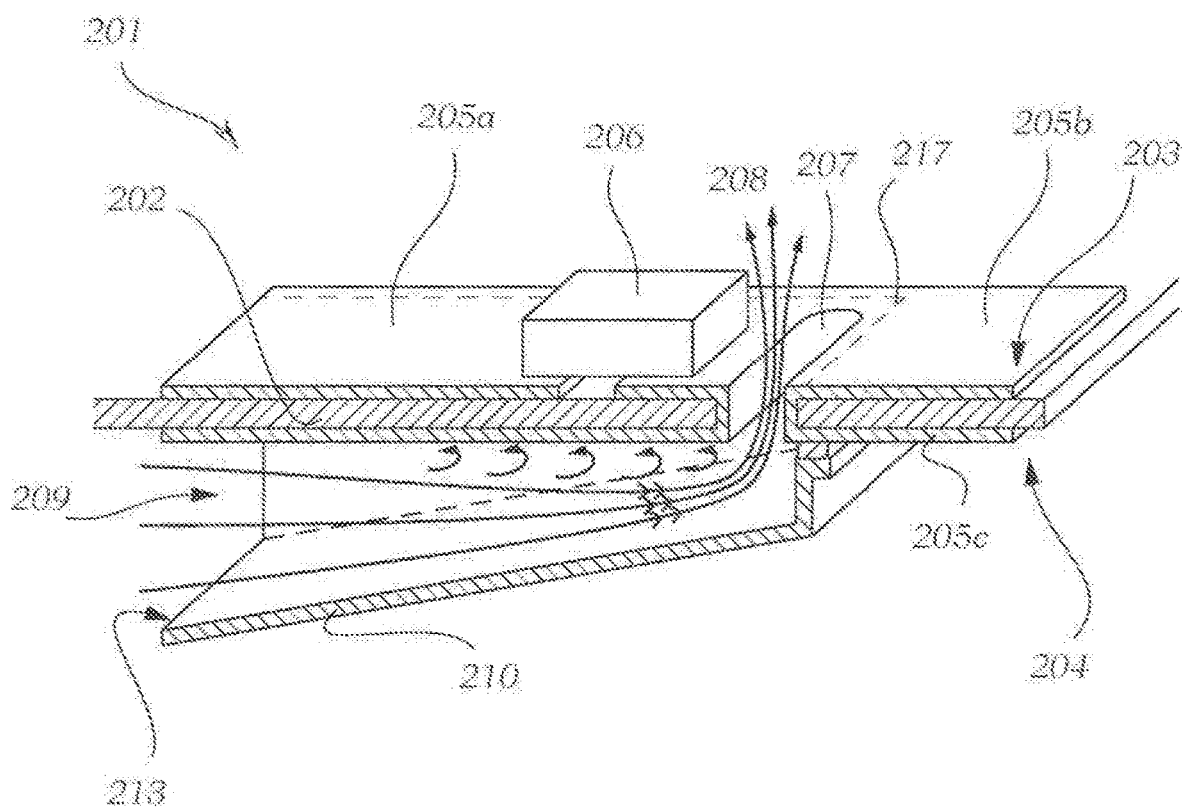
FIG. 8 shows a perspective view in the vertical section B-B of FIG. 7 on an upper side of the second embodiment.

FIG. 7 and FIG. 8 show a second exemplary embodiment of a component cooling device 201 with a circuit board 202 and an electronic component 206, which is mounted on an upper side 203. A hollow circuit board opening 207 has a substantially stadium-shaped or elliptical cross-sectional shape so as to provide a larger cross-section in a horizontal plane for a convection flow 208.

For the rest, the same as for the first exemplary embodiment applies.

Figure 9:
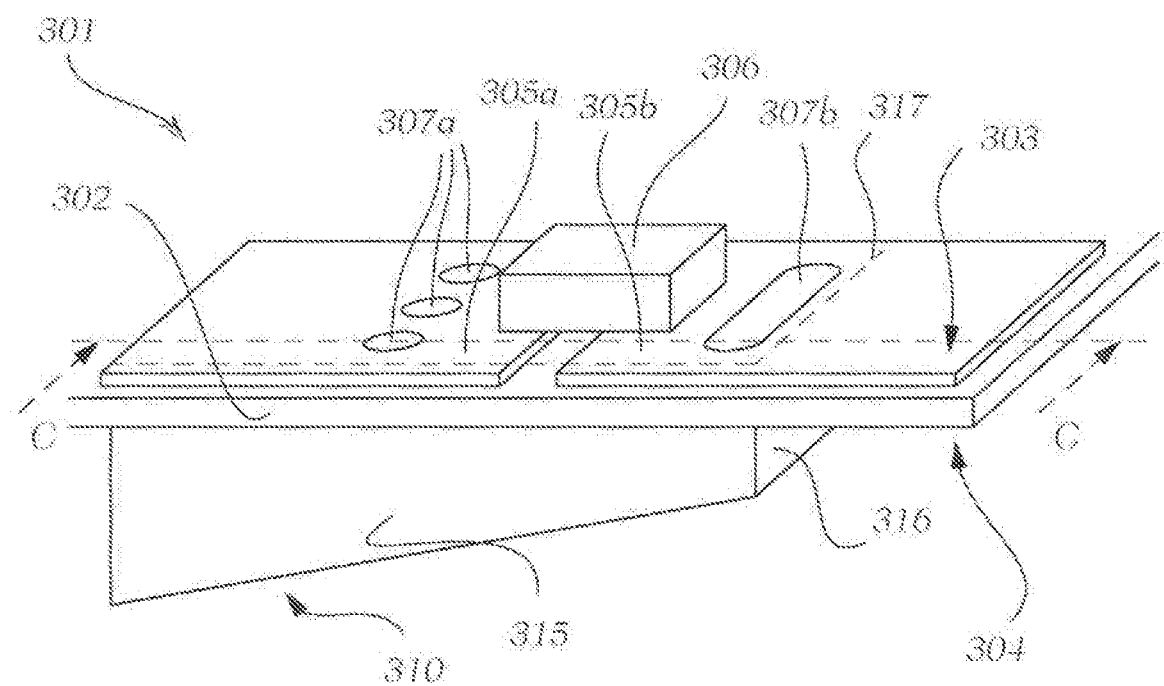
FIG. 9 shows a perspective view of a third embodiment of a component cooling device according to the invention.
Figure 10:
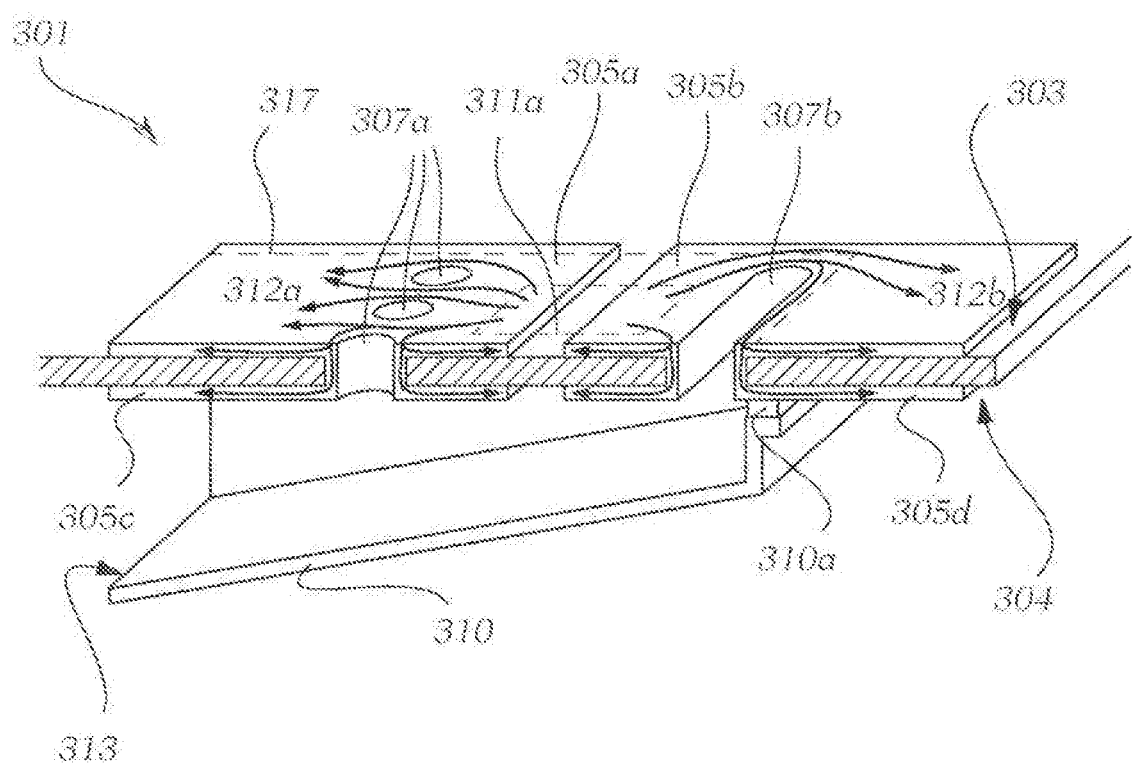
FIG. 10 shows a perspective view in the vertical section C-C of FIG. 9 on an upper side of the third embodiment, but without the component.
Figure 11:
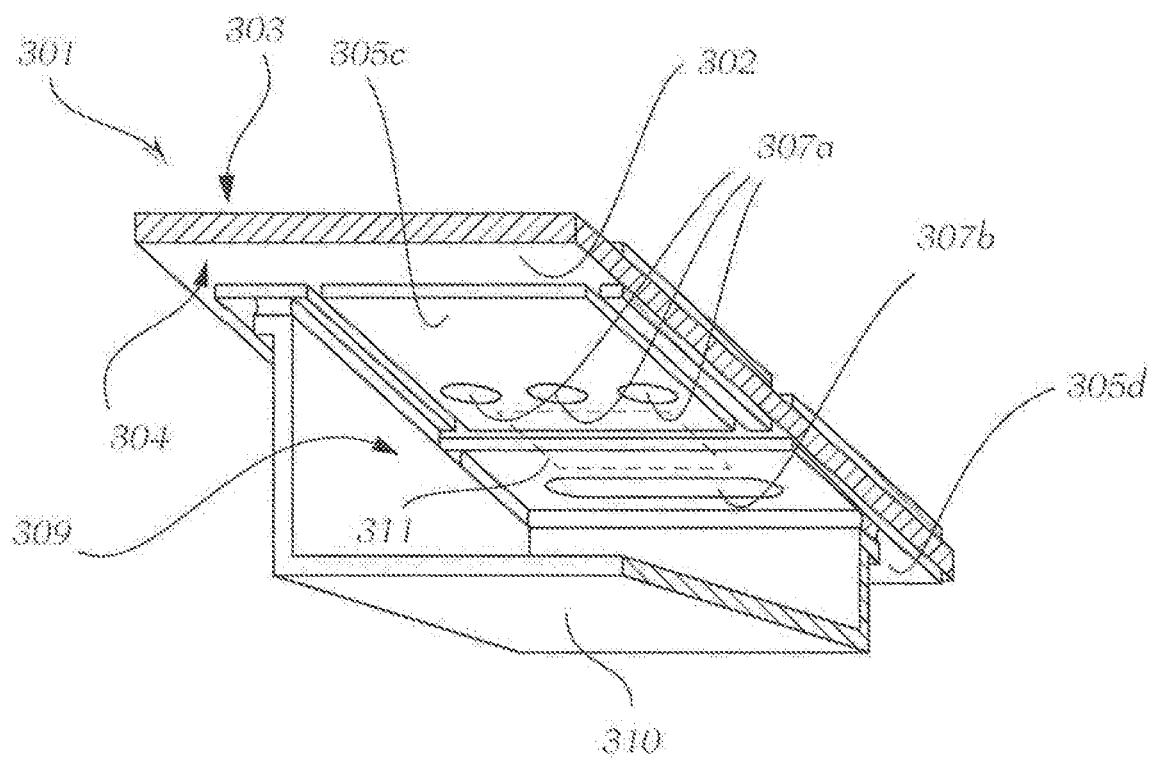
FIG. 11 shows a perspective view in the section C-C of FIG. 9 as observed along the flow channel towards a lower side of the third embodiment, but without the component.

FIG. 9 to FIG. 11 show a third exemplary embodiment of a component cooling device 301 with a circuit board 302 for assembly of an electronic component 306 on an upper side 303. In addition, hollow circuit board openings 307a and 307b are shown, wherein the circuit board openings 307a are formed for example by three hollow-cylindrical apertures and the circuit board opening 307b is formed by an aperture with, for example, an elongate stadium-shaped or elliptical cross-section. The shape of the circuit board opening is not crucial, but rather the cross-section, as this determines the strength of the convection flow 208. FIG. 10 shows how a thermal flow 312a, 312b can spread within conductive heat-spreading areas. For comparison purposes it is assumed here that both heat sources formed by the component 306 according to FIG. 9 have the same heat output, and the two thermal flows 312a and 312b have the same intensity. For improved clarity, the component 306 is not shown in FIG. 10. It can be seen that an improved heat dissipation by the thermal flow 312a is achieved by the three hollow-cylindrical circuit board openings 307a, as compared to that achieved by the thermal flow 312b, which must flow "around" the elongate circuit board opening 307b.

On the other hand, the cross-sectional area of all three hollow-cylindrical circuit board openings 307a together is smaller than the cross-sectional area of the elongate circuit board opening 307b. Consequently, an intensified convection flow is attained by the elongate circuit board opening 307b.

The choice of the shape of the circuit. board openings is often made based on the production process. Other shapes for the circuit board openings 307a, 307b are therefore possible.

By means of the circuit board openings 307a, 307b, the contact connection areas 305a, 305b according to FIG. 9 are thermally and electrically connected to the metal-coated lower side 304. In order to prevent the contact connection areas 305a, 305b from being electrically short-circuited when a solder connection 310a to a conductive metal guide 310 is established, it must be ensured that the lower side 304 comprises corresponding structured portions of the heat radiation areas 305c, 305d in the metal layer, which can be seen in FIG. 11.

For the rest, the same as for the previous exemplary embodiments applies.

Figure 12:
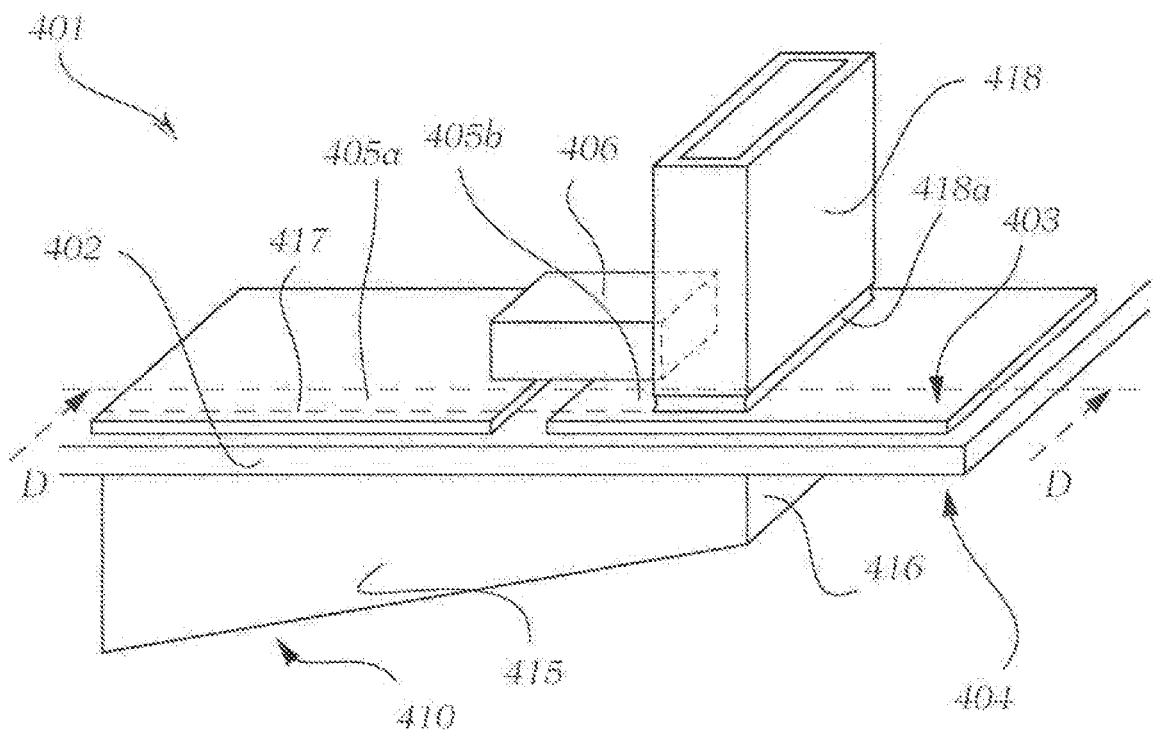
FIG. 12 shows a perspective view of a fourth embodiment of a component cooling device according to the invention.
Figure 13:
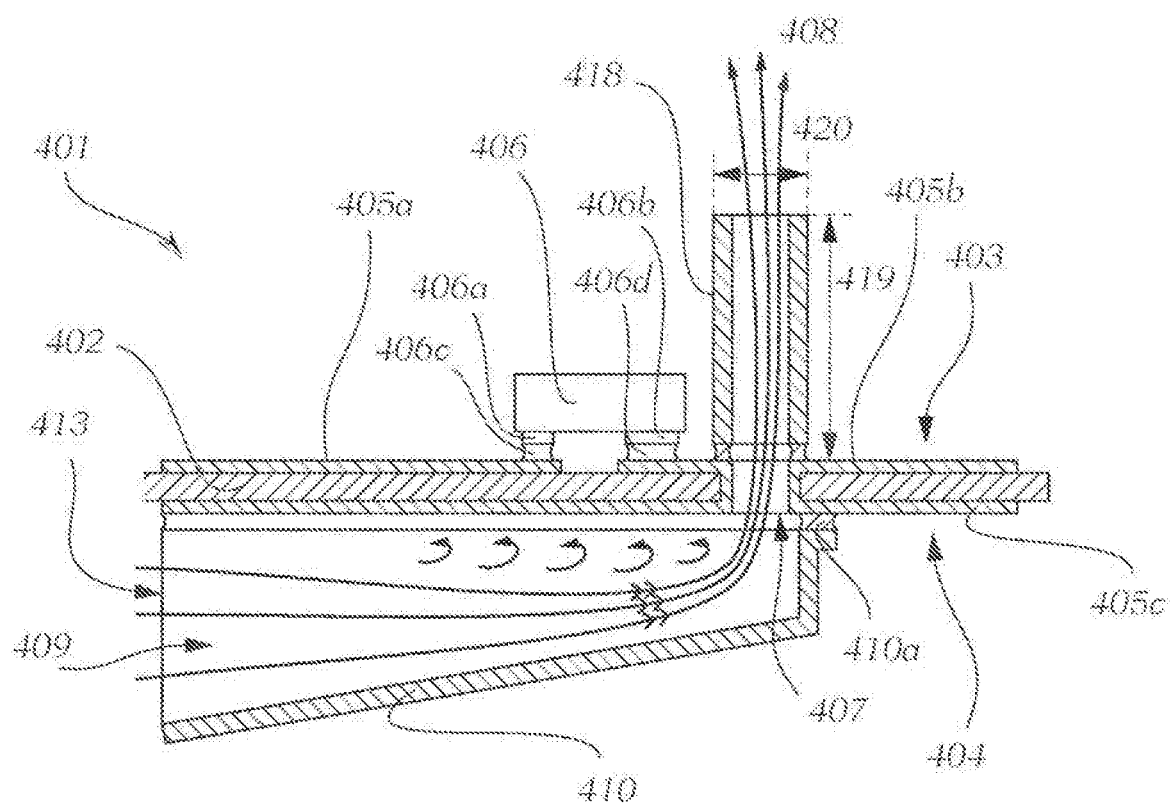
FIG. 13 shows a side view of the component cooling device in the vertical section D-D of FIG. 12.

FIG. 12 and FIG. 13 show a further exemplary embodiment of a component cooling device 401 with a circuit board 402 and an electronic component 406, which is assembled on an upper side 403. In addition, a thermal chimney structure 418 can be seen on a circuit board opening 407.

The thermal chimney structure 418 is used to intensify the vertical convection flow 408 and is arranged on the side opposite that on which the flow channel 409 is disposed, in such a way that the hollow circuit board opening 407 leads out into the thermal chimney structure 418.

Here, the chimney structure 418 has a vertical chimney height 419, wherein the chimney height 419 is greater than the diameter of the circuit board opening 407, preferably at least five times greater, particularly preferably at least ten times greater. The choice of the chimney height is made depending on the available installation space for the component cooling device 401. The horizontal chimney diameter 420 corresponds substantially to the diameter of the circuit board opening 407. The chimney structure 418 is preferably connected via a solder connection 418a to the circuit board 402, so as to attain a good thermal connection between the chimney structure 418 and the circuit board 402. The surface of the chimney structure 418 can thus be used to dissipate heat.

For the rest, the same as for the previous exemplary embodiments applies.

Figure 14:
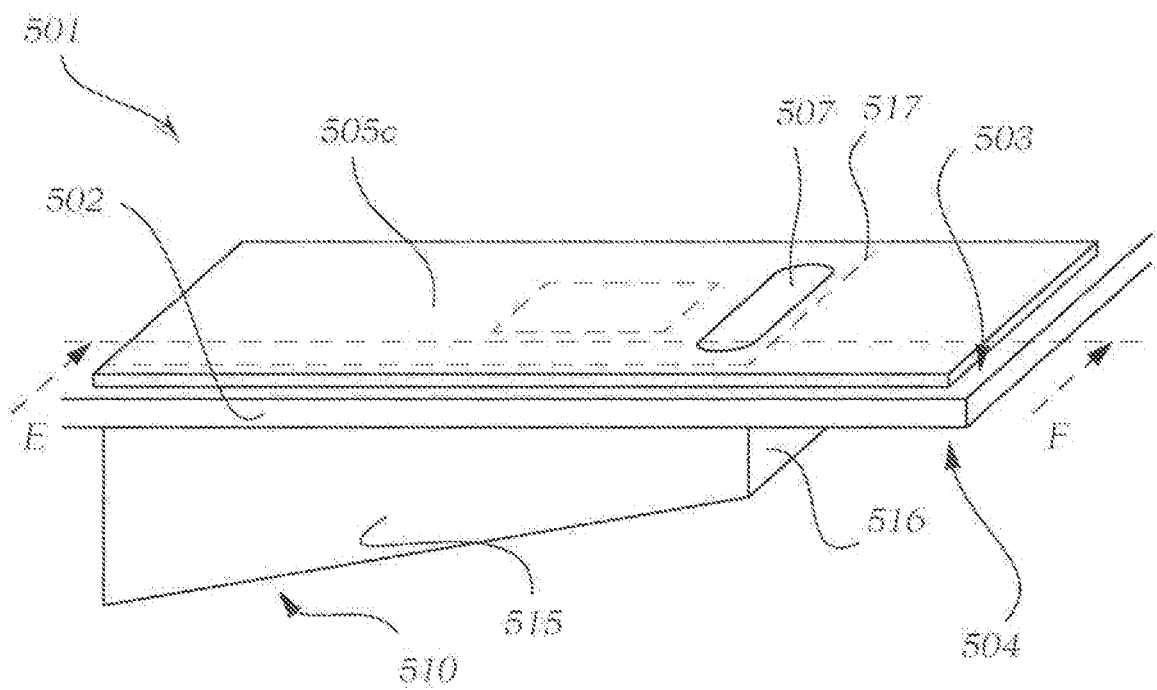
FIG. 14 shows a perspective view of a fifth embodiment of a component cooling device according to the invention.
Figure 15:
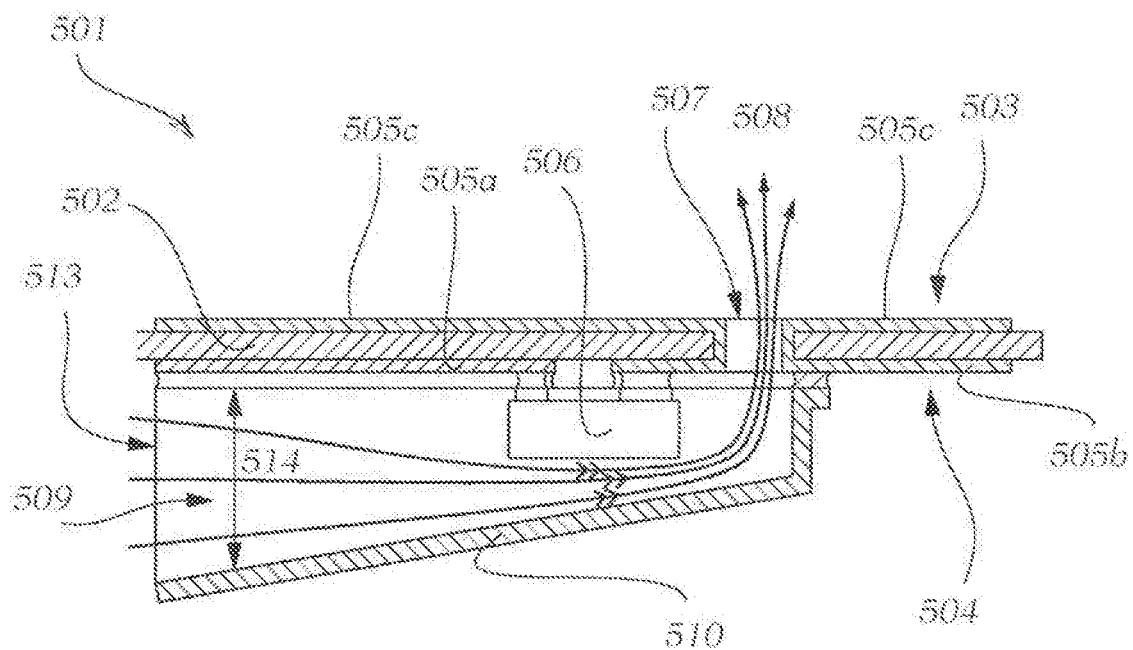
FIG. 15 shows a side view of the component cooling device in the vertical section E-E of FIG. 14.
Figure 16:
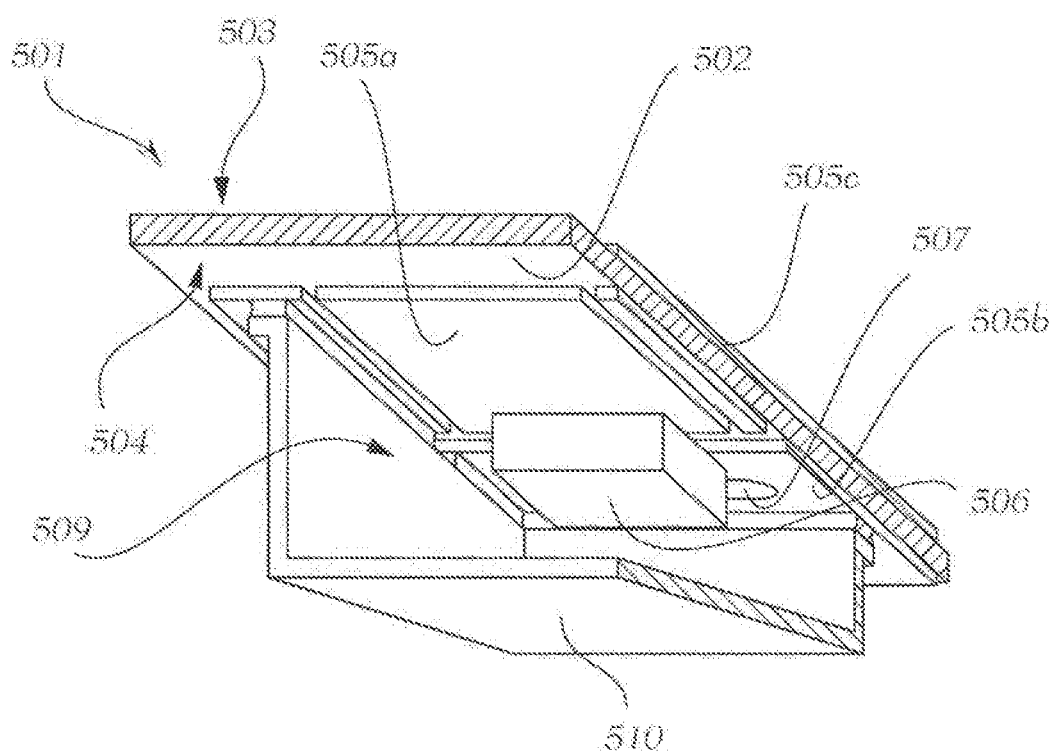
FIG. 16 shows a perspective view in the section E-E of FIG. 14 as observed along the flow channel towards an upper side of the second embodiment.

FIG. 14 to FIG. 16 show a fifth embodiment of a component cooling device 501. A component 506 is arranged on a lower side 504 of a circuit board 502, that is to say the component 506 is arranged within a flow channel 509. The flow flowing in the flow channel 509 can thus directly dissipate the waste heat of the component 506, and the efficiency of the component cooling device 501 can be further increased. This variant of the component cooling device 501 according to the invention, however, is possible only when the component 506 does not have to perform an additional function, for example light emission upwardly from the circuit board 502 in the case of a light-emitting diode. The shown variant of the component cooling device can be suitable with use of passive components for example as component 506, for example ohmic resistors.

For the rest, the same as for the previous exemplary embodiments applies.

In principle, the exemplary embodiments described here can be combined with one another, which means for example a chimney structure may be used in a vehicle headlamp in accordance with the requirements or available installation space. For example, the position, the number and/or the shaping of the selected circuit board openings 107, 207, 307a, 307b, 407, 507 can also be adapted for the particular application.

The same is true for the guide 10, 110, 210, 310, 410, 510, which for example may have a curved shaping or may vary in terms of its dimensions. The guide 10, 110, 210, 310, 410, 510 itself may be connected in different ways to the circuit board 102, 202, 302, 402, 502, for example by adhesive bonding, preferably by an adhesive that is a poor electrical conductor or that is not electrically conductive, but is a good thermal conductor, or by means of plug-in or screw connections.

Alternatively, the flow channel according to the invention may be angled so as to be able to satisfy any relevant installation instructions. The flow channel may be formed in one piece; this means that, here, the circuit board does not necessarily form part of the flow channel in the form of a side wall. The position of the outlet in the flow channel is in no way limited to the positions shown in the exemplary embodiments, and instead may be adapted accordingly on the basis of the particular installation situation, and for example may also be arranged in the end face. It is also conceivable for one or more flow channels to be provided for a plurality of components, which flow channels additionally share important components with one another as appropriate, such as side walls of flow channels or jointly used circuit board openings.

The outlet of the flow channel may be connected to the hollow circuit board openings alternatively by additional connection elements, such as one or more lines or pipes. This may be necessary where, for example, the available installation space is limited and the heat is to be dissipated in an intensified manner via the flow channel.

At least all of the exemplary embodiments described here and the developments of the invention according to the description as stated at the outset consequently can be combined and are covered by the scope of protection of the following claims.

LIST OF REFERENCE SIGNS 101, 201, 301, 401, 501 component cooling device
102, 202, 302, 402, 502 circuit board
103, 203, 303, 403, 503 upper side
104, 204, 304, 404, 504 lower side
105a, 205a, 305a, 405a, 505a first contact connection area
105b, 205b, 305b, 405b, 505b second contact connection area
105c, 205c, 305c, 305d, 405c, 505c heat radiation area
6, 106, 206, 306, 406, 506 component
6a, 6b, 106a, 106b contact connections of the component
106c, 106d, 406c, 406d solder connection of the component
107, 207, 307a, 307b, 407, 507 hollow circuit board opening
101, 208, 408, 508 convection flow
109, 209, 309, 409, 509 flow channel
10, 110, 210, 310, 410, 510 guide
110a, 210a, 310a, 410a, 510a solder connection of the guide
311 cooling area
311a component contour
312a, 312b thermal flow
13, 113, 213, 313, 413, 513 inlet
114 height of the flow channel
15, 115, 215, 315, 415, 515 side walls of the flow channel
16, 116, 216, 316, 416, 516 end face of the flow channel
117, 217, 317 delimitation area
418 chimney structure
418a solder connection of the chimney structure
419 chimney height
420 chimney diameter

The invention claimed is:

1. A component cooling device (101, 201, 301, 401, 501) comprising:
   a circuit board (102, 202, 302, 402, 502), the circuit board (102, 202, 302, 402, 502) having an upper side (103, 203, 303, 403, 503) and a lower side (104, 204, 304, 404, 504) facing away from the upper side (103, 203, 303, 403, 503); and
   at least one electronic component (6, 106, 206, 306, 406, 506) and at least one hollow circuit board opening (107, 207, 307a, 307b, 407, 507) for a gaseous cooling medium for cooling the at least one electronic component,
   wherein on the lower side (104, 204, 304, 404, 504) of the circuit board (102, 202, 302, 402, 502) is provided a guide (10, 110, 210, 310, 410, 510) which forms a flow channel (109, 209, 309, 409, 509) for a convection flow of the gaseous cooling medium,
   wherein the guide has at least one inlet (13, 113, 213, 313, 413, 513) and at least one outlet which is formed by the at least one hollow circuit board opening (107, 207, 307a, 307b, 407, 507), and
   wherein the at least one inlet (13, 113, 213, 313, 413, 513) has a cross-section which is decreasing to a smaller cross-section of the at least one outlet.

2. The component cooling device (101, 201, 301, 401, 501) according to claim 1, wherein the flow channel (109, 209, 309, 409, 509) is delimited by the guide (10, 110, 210, 310, 410, 510) and a region of the lower side (104, 204, 304, 404, 504) of the circuit board (102, 202, 302, 402, 502), wherein the at least one hollow circuit board opening (107, 207, 307a, 307b, 407, 507) is likewise arranged in this region.

3. The component cooling device (101, 201, 301, 401, 501) according to claim 1, wherein a region of the flow channel (109, 209, 309, 409, 509) on the lower side (104, 204, 304, 404, 504) of the circuit board (102, 202, 302, 402, 502) comprises at least one cooling area (111, 311), wherein the at least one cooling area (111, 311) is delimited substantially by a contour (311a) of the at least one electronic component (6, 106, 206, 306, 406, 506) on the circuit board (102, 202, 302, 402, 502) and is arranged on the lower side (104, 204, 304, 404, 504) of the circuit board (102, 202, 302, 402, 502).

4. The component cooling device (101, 201, 301, 401, 501) according to claim 1, wherein the at least one inlet (13, 113, 213, 313, 413, 513) of the flow channel (109, 209, 309, 409, 509) has a rectangular shape, and the flow channel (109, 209, 309, 409, 509) has a height (114) transversely to the circuit board (102, 202, 302, 402, 502) that decreases from the at least one inlet (13, 113, 213, 313, 413, 513) to the at least one outlet.

5. The component cooling device (101, 201, 301, 401, 501) according to claim 1, wherein the guide (10, 110, 210, 310, 410, 510) is formed from three adjoining side walls (15, 115, 215, 315, 415, 515) and an adjoining end face (16, 116, 216, 316, 416, 516) and the guide (10, 110, 210, 310, 410, 510), jointly with the region of the lower side (104, 204, 304, 404, 504) of the circuit board (102, 202, 302, 402, 502) and the at least one hollow circuit board opening (107, 207, 307a, 307b, 407, 507), forms the flow channel (109, 209, 309, 409, 509).

6. The component cooling device (101, 201, 301, 401, 501) according to claim 1, wherein at least one contact connection area (105a, 205a, 305a, 405a, 505a, 105b, 205b, 305b, 405b, 505b) on the upper side (103, 203, 303, 403, 503) is connected to at least one heat radiation area (105c, 205c, 305c, 305d, 405c, 505c) on the lower side (104, 204, 304, 404, 504) by at least one hollow, electrically conductive circuit board opening (107, 207, 307a, 307b, 407, 507).

7. The component cooling device (101, 201, 301, 401, 501) according to claim 1, wherein the circuit board (102, 202, 302, 402, 502) is formed in one layer and has metal layers on both sides.

8. The component cooling device (101, 201, 301, 401, 501) according to claim 1, wherein at least one thermal chimney structure (418) for intensifying the at least one convection flow (108, 208, 408) is arranged on the upper side (103, 203, 303, 403, 503) and the at least one hollow circuit board opening (107, 207, 307a, 307b, 407, 507) leads out into the at least one thermal chimney structure (418).

9. The component cooling device (101, 201, 301, 401, 501) according to claim 8, wherein the at least one thermal chimney structure (418) has a chimney height and a chimney diameter and the chimney height (419) is greater than the diameter of the hollow circuit board opening (107, 207, 307a, 307b, 407, 507), wherein the chimney diameter (420) corresponds substantially to the diameter of the at least one hollow circuit board opening (107, 207, 307a, 307b, 407, 507).

10. The component cooling device (101, 201, 301, 401, 501) according to claim 8, wherein the at least one thermal chimney structure has a chimney height and a chimney diameter and the chimney diameter (420) at least in part extends in a non-constant manner along the chimney height (419) or, at one end of the at least one thermal chimney structure (418) at which a solder connection (418*a*) is provided, extends in a widening manner.

11. The component cooling device (101, 201, 301, 401, 501) according to claim 8, wherein a plurality of chimney structures (418) are arranged in a row upstream or downstream of the at least one hollow circuit board opening (107, 207, 307*a*, 307*b*, 407, 507) and are made of different materials, which are designed to be mechanically rigid or elastically malleable and jointly form a combined chimney structure.

12. The component cooling device (101, 201, 301, 401, 501) according to claim 11, wherein the combined chimney structure is connected to at least one further component of a vehicle headlamp.

13. The component cooling device (101, 201, 301, 401, 501) according to claim 1, wherein the circuit board (102, 202, 302, 402, 502) in an installed position in a vehicle headlamp is oriented substantially horizontally, with an angle of the circuit board (102, 202, 302, 402, 502) to the horizontal in the range of −45° to +45°.

14. The component cooling device (101, 201, 301, 401, 501) according to claim 1, wherein the component cooling device (101, 201, 301, 401, 501) is arranged within a vehicle headlamp and is designed to cool a light source for a main beam light source or a dipped beam light source.

15. A vehicle headlamp having one or more light sources which can radiate light in order to produce a light distribution, with a component cooling device according to claim 1 for cooling the one or more light sources.

16. The component cooling device (101, 201, 301, 401, 501) according to claim 9, wherein the chimney height (419) is at least five times greater than the diameter of the at least one hollow circuit board opening (107, 207, 307*a*, 307*b*, 407, 507).

17. The component cooling device (101, 201, 301, 401, 501) according to claim 9, wherein the chimney height (419) is at least ten times greater than the diameter of the at least one hollow circuit board opening (107, 207, 307*a*, 307*b*, 407, 507).

18. The component cooling device (101, 201, 301, 401, 501) according to claim 11, wherein each of the plurality of chimney structures (418) is in the form of a tube.

19. The component cooling device (101, 201, 301, 401, 501) according to claim 18, wherein the tube is a rubber or plastics tube.

20. The component cooling device (101, 201, 301, 401, 501) according to claim 13, wherein the angle of the circuit board (102, 202, 302, 402, 502) to the horizontal is in the range of −10° to +10°.

21. The component cooling device (101, 201, 301, 401, 501) according to claim 13, wherein the angle of the circuit board (102, 202, 302, 402, 502) to the horizontal is in the range of −5° to +5°.

22. The vehicle headlamp according to claim 15, wherein the light distribution is a main beam or dipped beam light distribution.

\* \* \* \* \*